United States Patent
Schierling et al.

(10) Patent No.: US 11,362,512 B2
(45) Date of Patent: Jun. 14, 2022

(54) ELECTRONIC SWITCH WITH OVERVOLTAGE LIMITER

(71) Applicant: Siemens Aktiengesellschaft, Munich (DE)

(72) Inventors: Hubert Schierling, Erlangen (DE); Benno Weis, Hemhofen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 347 days.

(21) Appl. No.: 16/630,710

(22) PCT Filed: Jun. 26, 2018

(86) PCT No.: PCT/EP2018/067022
§ 371 (c)(1),
(2) Date: Jan. 13, 2020

(87) PCT Pub. No.: WO2019/011642
PCT Pub. Date: Jan. 17, 2019

(65) Prior Publication Data
US 2021/0091561 A1   Mar. 25, 2021

(30) Foreign Application Priority Data
Jul. 14, 2017 (EP) .................. 17181402

(51) Int. Cl.
*H02H 9/04* (2006.01)
*H02H 7/22* (2006.01)
(Continued)

(52) U.S. Cl.
CPC ............. *H02H 9/04* (2013.01); *H02H 3/087* (2013.01); *H02H 7/222* (2013.01); *H03K 17/56* (2013.01)

(58) Field of Classification Search
CPC .......... H02H 9/002; H02H 9/04; H02H 9/041; H02H 9/045; H02H 7/222; H02H 3/087;
(Continued)

(56) References Cited

U.S. PATENT DOCUMENTS

| 2005/0162139 A1 | 7/2005 | Hirst |
| 2008/0074816 A1 | 3/2008 | Omaru |

(Continued)

FOREIGN PATENT DOCUMENTS

| CN | 102025141 A | 4/2011 |
| CN | 103580097 A | 2/2014 |

(Continued)

OTHER PUBLICATIONS

Translation of EP2810290B1. May 4, 2016. (Year: 2016).*
(Continued)

*Primary Examiner* — Jared Fureman
*Assistant Examiner* — Christopher J Clark
(74) *Attorney, Agent, or Firm* — Henry M. Feiereisen LLC (57) ABSTRACT

An electronic switch for a DC voltage system includes at least two turn-off semiconductor switches, a varistor and a capacitor, and at least two diodes connected in series with opposite polarity. The turn-off semiconductor switches are connected at a connection point in series with opposite polarity between a first connection of the electronic switch and a second connection of the electronic switch. In order to provide improved overvoltage protection, the varistor and the capacitor form a series connection, with one end of the series connection connected to the connection point. A DC voltage system employing the electronic switch and a method for limiting overvoltages in the electronic switch or in a corresponding DC voltage system are also disclosed. Inductive energy of an element connected to the electronic (Continued)

switch is transferred to the capacitor when a limit, defined by the varistor, has been exceeded.

14 Claims, 5 Drawing Sheets

(51) Int. Cl.
*H02H 3/087* (2006.01)
*H03K 17/56* (2006.01)

(58) Field of Classification Search
CPC .... H01H 33/596; H02J 7/0026; H02J 7/0029; H02J 1/00–16
See application file for complete search history.

(56) References Cited

U.S. PATENT DOCUMENTS

| | | |
|---|---|---|
| 2014/0028088 A1 | 1/2014 | Salziger et al. |
| 2014/0029152 A1 | 1/2014 | Mazzola et al. |
| 2014/0078622 A1 | 3/2014 | Crane |
| 2015/0236498 A1* | 8/2015 | Davidson ............... H03K 17/74 361/57 |
| 2016/0300671 A1* | 10/2016 | Ergin .................... H01H 9/548 |

FOREIGN PATENT DOCUMENTS

| | | | |
|---|---|---|---|
| CN | 204668929 U | 9/2015 | |
| CN | 106099678 A | 11/2016 | |
| DE | 698 04 613 T2 | 11/2002 | |
| DE | 102011079723 A1 | 1/2013 | |
| EP | 2810290 B1 * | 5/2016 | ........... H01H 33/596 |

OTHER PUBLICATIONS

PCT International Search Report and Written Opinion of International Searching Authority dated Oct. 18, 2018 corresponding to PCT International Application No. PCT/EP2018/067022 filed Jun. 26, 2018.

* cited by examiner

ELECTRONIC SWITCH WITH OVERVOLTAGE LIMITER

CROSS-REFERENCES TO RELATED APPLICATIONS

This application is the U.S. National Stage of International Application No. PCT/EP2018/067022, filed Jun. 26, 2018, which designated the United States and has been published as international Publication No, WO 2019/011642 A1 and which claims the priority of European Patent Application, Serial No. 17181402.3, filed Jul. 14, 2017, pursuant to 35 U.S.C. 119(a)-(d).

BACKGROUND OF THE INVENTION

The invention relates to an electronic switch having at least one turn-off semiconductor switch, a varistor and a capacitor, wherein the electronic switch has a first connection and a second connection, between which an electrically conductive connection is makeable or breakable by means of the at least one turn-off semiconductor switch on the basis of the switching state of the turn-off semiconductor switch. Further, the invention relates to a DC voltage system having an electronic switch of this kind, wherein the DC voltage system has a first and a second electrical potential, wherein one of the connections of the electronic switch is connected to the first potential of the DC voltage system. Further, the invention relates to a method for limiting overvoltages in an electronic switch of this kind or in a DC voltage system of this kind.

In order to be able to switch a DC current, DC switches are required. In contrast to the switching of AC switches, these are of distinctly more complex design, since during DC operation, as prevails in DC voltage networks, for example, the current has no zero crossing at which quenching of the current can easily be implemented. A DC voltage network is also referred to as a DC network.

In this case, it has been found to be advantageous to use electronic switches for the design of a DC switch. These include for example semiconductor switches such as transistors or thyristors. Provided that they are turn-off semiconductors, they are suitable as a replacement for mechanical switches for switching a DC current.

In the event of a fault, the rapid turning-off of the semiconductors quickly becomes a problem. The problem is now that the supply line from the DC network to the fault location has an inductance that is proportional to the length of the line and typically approximately 500 nH/m. With a supply line length of 50 m, an inductance of approximately 25 pH is therefore obtained. The turn-off process of the semiconductor switch results in a high overvoltage across this inductance, because the current in the inductance cannot suddenly become zero and wants to continue to flow, but does not have a freewheeling path. The potential at the connection of the switch therefore rises to high values. This voltage is therefore also across the electronic switch and can damage or destroy it.

Mechanical switches solve the problem by turning off significantly more slowly and also converting the stored energy in their arc into heat. However, mechanical switches have the disadvantage that their slow turning-off means that they can produce an enormous voltage dip in the DC network, which adversely affects other loads connected in parallel.

The invention is based on the object of improving an electronic switch.

SUMMARY OF THE INVENTION

This object is achieved by an electronic switch having at least one turn-off semiconductor switch, a varistor and a capacitor, wherein the electronic switch has a first connection and a second connection, between which an electrically conductive connection is makeable or breakable by means of the at least one turn-off semiconductor switch on the basis of the switching state of the turn-off semiconductor switch, wherein a series connection comprising the varistor and the capacitor is connected via a first diode to the first connection and via a second diode to the second connection in each case. Further, the object is achieved by a DC voltage system having an electronic switch as set forth above, wherein an electrical connection of the DC voltage system between the first connection and the second connection of the electronic switch is breakable by means of the electronic switch. Further, the object is achieved by a method for limiting overvoltages in an electronic switch of this kind or in a DC voltage system of this kind, wherein inductive energy of an element connected to the electronic switch is transferred to the capacitor during a turn-off process of at least one turn-off semiconductor switch after a limit stipulated by the varistor is exceeded.

The invention is based on the insight that an overvoltage, brought about by inductances in the system, can easily be eliminated by means of a series connection comprising a varistor and a capacitor. This allows damage or destruction of the turn-off semiconductor or of the turn-off semiconductors of the electronic switch to be reliably prevented. In this case, the varistor has the task of becoming conductive in the event of an increased voltage and supplying the inductive energy stored in an element of the DC voltage system, i.e. the electric energy stored for example in inductances, in particular parasitic inductances, to a capacitor. Said capacitor absorbs the energy without being destroyed.

If, on the other hand, it is desirable to protect the electronic switch against overvoltages merely using a varistor without using a capacitor, the said varistor is difficult to dimension. At a maximum voltage of for example 850 V for the DC network, it can only draw a minimal current so that it is not destroyed in the event of a fault. Assuming a maximum reverse voltage of for example 1200 V for the semiconductors, it needs to carry the whole fault current, however, in order to limit the overvoltage. Varistors having such hard characteristics are not available economically.

If, Instead of the varistor, just a capacitor is used to absorb the inductive energy, then it needs to be designed to be of appropriate size so that it can absorb the energy without being charged to inadmissibly high values. The design rule for the capacitance of the capacitor is dependent on the square of the quotient of the turn-off current of the semiconductor and the admissible voltage increase beyond the operational DC voltage. This results in high demand in values for the capacitance C of the capacitor. Since the fault can moreover arise in any direction of current flow, but the capacitor can absorb voltage only in one direction when an electrolytical capacitor is used, and the charging current for the capacitor needs to be limited when the semiconductor is turned on again, the limiting design needs to be produced separately for both voltage directions, for example by means of RCD circuitry.

Only the inventive combination of a varistor with a capacitor to form a series connection leads to a particularly advantageous solution in which the demands on the varistor and on the capacitance C of the capacitor are low enough for this circuit to be manufacturable and implementable easily and inexpensively.

If the series connection comprising the varistor and the capacitor is arranged such that they have their first end connected via diodes to the respective connections of the electronic switch, one of these connections is connected to a first potential of the DC network and the second end of the series connection is connected to a second potential of the DC network, then the varistor can be designed to be distinctly less powerful. It is thus possible for a less expensive varistor to be used.

This circuit arrangement allows an overvoltage during a turn-off process for a current to be successfully limited for both directions of current flow, even if the capacitor is a unipolar capacitor. In particular electrolytic capacitors are thus suitable for use in an overvoltage limiter of an electronic switch.

In this case, the electronic switch has at least two turn-off semiconductor switches arranged in a series connection, wherein two of the at least two turn-off semiconductor switches are arranged in antiseries with one another, wherein the series connection is arranged between the first connection and the second connection of the electronic switch. This arrangement allows DC currents of different polarity to be switched using the electronic switch. In this context, antiseries means that the turn-off semiconductor switches are each arranged such that the switching element of the turn-off semiconductor switch can carry a current of different polarity and turn off in each case. The individual turn-off semiconductor modules often already have a diode, which is arranged in parallel with the switching element of the semiconductor switch. The diode is designed to be in antiparallel with the switching element of the turn-off semiconductor switch. This means that it can carry a current that is the opposite of the current for the switching element. Such turn-off semiconductor switches are also referred to as reverse-conducting switches.

The diodes arranged between the varistor and the capacitor and the respective connections of the electronic switch allow the series connection comprising the varistor and the capacitor to be used to absorb an energy from an inductance that is independent of the direction of current flow through the switch. It is therefore easily possible to prevent protection against inadmissibly high voltages across the turn-off semiconductor switches. This merely requires an overvoltage limiter in the form of a series connection comprising a varistor and a capacitor.

In this case, the first diode has its anode connected to the first connection of the electronic switch and has its cathode connected to a first end of the series connection comprising the varistor and the capacitor, wherein the second diode has its anode connected to the second connection of the electronic switch and has its cathode connected to the cathode of the first diode. The arrangement of the diodes in this orientation allows an overvoltage to be limited to admissible values for the turn-off semiconductor switches, said overvoltage being independent of the direction of current flow of a current to be turned off through the electronic switch. For the diodes, the diodes of the turn-off semiconductor switch that are arranged in antiparallel and already present can advantageously be used. The use of further or additional diodes can thus be dispensed with. Alternatively, it is also possible to use further diodes, arranged as described, besides the diodes of the turn-off semiconductor switch that are already present. This allows the turn-off semiconductor switches to be arranged arbitrarily within the electronic switch.

This configuration is particularly advantageous if the electronic switch is arranged in a first potential of a DC network and the second end of the series connection comprising the varistor and the capacitor is connected to a second potential of the DC network. The difference between the first and second potentials of the DC network forms the voltage of the DC network.

In one advantageous configuration of the invention, a resistor is arranged in parallel with the series connection comprising the first and second diodes. If the second end of the series connection comprising the varistor and the capacitor is connected to a second potential of the DC network, the capacitor needs to be charged to the voltage of the DC network during operation or before operation begins. To avoid an excessively high charging current in this case, it has been found to be advantageous to use a resistor and to arrange it in parallel with the series connection of the diodes. If a first switch is also added to the first diode in series, it is possible to open the switch to achieve the effect that a charging current for the capacitor flows via the resistor. Inadmissibly high charging currents for the capacitor in the DC network can therefore be reliably prevented.

In a further advantageous configuration of the invention, a second switch is arranged in series with the resistor. This switch can easily be used to control or regulate the precharging of the capacitor via the resistor.

In a further advantageous configuration of the invention, a third switch, in particular a multipole switch, is arranged between the first connection of the electronic switch and one of the turn-off semiconductor switches. Said switch is used to galvanically isolate the electronic switch from the DC network. Furthermore, it is possible to dispense with the first switch by means of this third switch and still to allow precharging of the capacitor via the resistor. Dispensing with the first switch has a particularly positive effect on the costs of the overvoltage limiter, since the first switch needs to be designed for a high current in the event of a fault. This configuration allows the first switch to be dispensed with, leading to significantly cheaper costs in the switch design.

In a further advantageous configuration of the invention, the electronic switch has at least four diodes, wherein the at least four diodes form a bridge rectifier circuit, wherein the series connection comprising the varistor and the capacitor is arranged in the rectified path of the bridge rectifier circuit, and the inputs of the bridge rectifier circuit are each connected to one of the connections of the electronic switch. This arrangement allows an overvoltage limiter to be implemented that requires no contact with a second potential of the DC network. All of the measures pertaining to the precharging of the capacitor can therefore be dispensed with. The limiting circuit as a series connection comprising the varistor and the capacitor can easily be implemented in the electronic switch without increasing the number of connections of the electronic switch. In other words, with this type of overvoltage limiter, the electronic switch continues to manage with precisely two connections. The rectifier circuit allows this overvoltage limiter to be used for an electronic switch that can turn off a current in both directions of current flow.

The rectifier circuit furthermore ensures that the use of a unipolar capacitor for voltage limiting is possible regardless of the direction of current flow through the switch. In particular the use of electrolytic capacitors, which are available inexpensively, is particularly advantageous for this configuration.

In a further advantageous configuration of the invention, the electronic switch has a third connection, wherein a second end of the series connection comprising the varistor and the capacitor is connected to the third connection. The first and second connections are used to be able to break a connection in a DC voltage system. The second end of the series connection is therefore the end of the series connection that is not connected to the first and second diodes. The first connection is thus connected to a first potential of the DC voltage system. The third connection is intended and/or designed to be connected to a second potential of the DC voltage system. In order to transfer energy via a DC voltage system, there need to be at least two different potentials present. These can advantageously be used for connection to the first connection and the third connection. Similarly, it is possible to use the ground potential as second potential.

BRIEF DESCRIPTION OF THE DRAWING

The invention is described and explained in more detail below with reference to the exemplary embodiments depicted in the figures, in which.

DETAILED DESCRIPTION OF PREFERRED EMBODIMENTS

Figure 1:
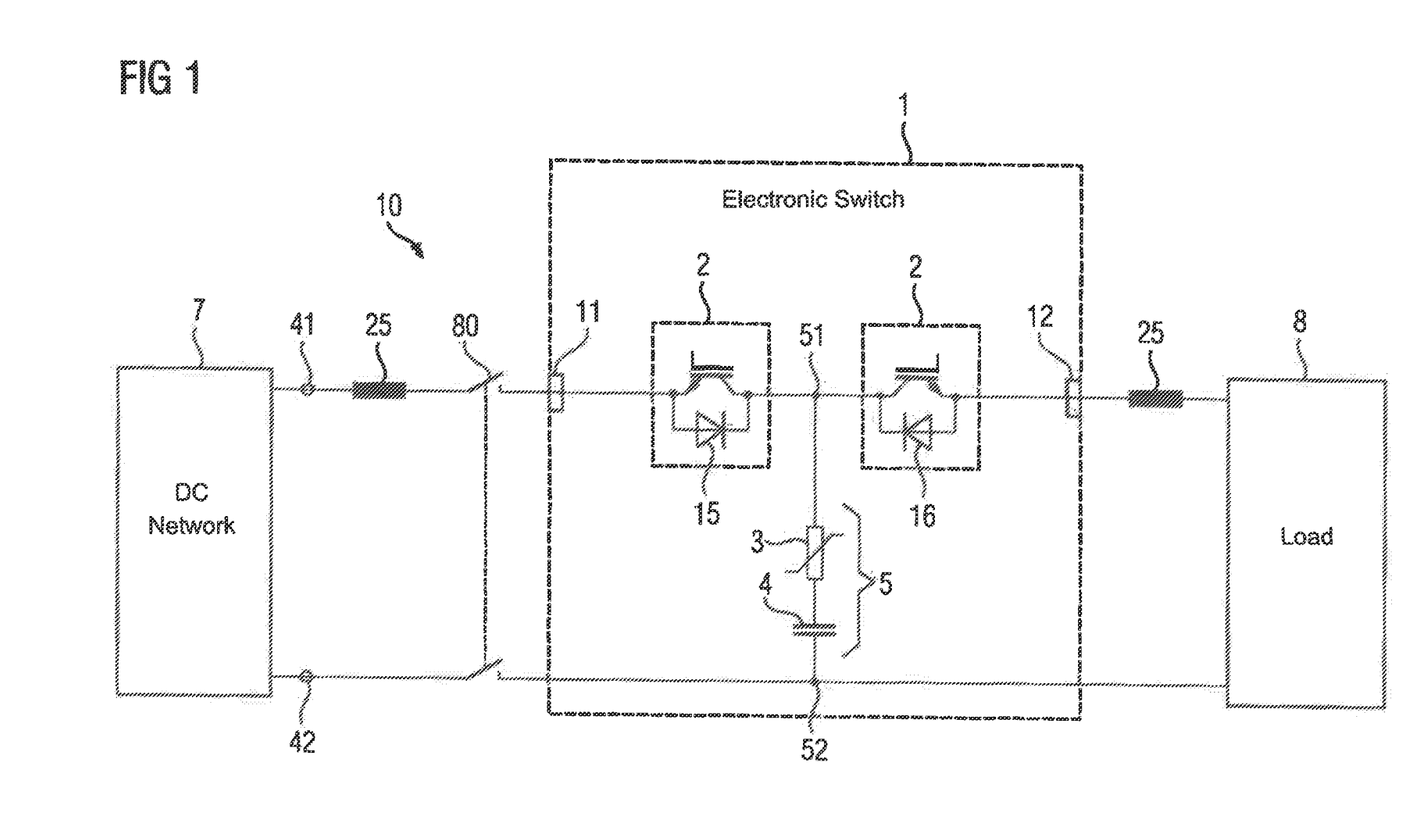
FIG. 1 to FIG. 5 show exemplary embodiments of an electronic switch with an overvoltage limiter.

FIG. 1 shows a DC voltage system 10 having a load 8 powered by a DC network 7. The DC voltage of the DC network 7 is applied between the first potential 41 and the second potential 42. An electronic switch 1 is arranged between the DC network 7 and the load 8. Next to this electronic switch 1, there is also a contactor or isolator 80, by means of which the load 8 can be galvanically isolated from the DC network 7. The contactor or the isolator 80 is not absolutely necessary for the operation of the electronic switch 1. The inductances present in the supply lines are represented by the element 25. These can be parasitic inductances of lines or else inductive components, such as inductors, coils or transformers. The electronic switch 1 has a series connection comprising two turn-off semiconductor switches 2 between its first connection 11 and its second connection 12. These are arranged in antiseries with one another. That means that each switching element of the two turn-off semiconductor switches 2 can carry and hence switch a current in a different direction. To increase the blocking capability, i.e. the voltage to be switched, the number of turn-off semiconductor switches 2 in the series connection 5 can be increased further.

Arranged in parallel with the switching element is a diode 15, 16 in antiparallel. That means that the current through the diode flows in the opposite direction from the current through the correspondingly antiparallel switching element of the turn-off semiconductor switch 2. The antiseries arrangement of the two turn-off semiconductor switches 2 led to the current between a first connection 11 and a second connection 12 flowing through a diode of one turn-off semiconductor switch and through a switching element of the other turn-off semiconductor switch. The series connection comprising the turn-off semiconductor switches 2 is connected to the first potential 41 of the DC network 7. The electronic switch 1 furthermore has a varistor 3 and a capacitor 4. These form a series connection 5. This series connection 5 has a first end 51 connected to the series connection comprising the two turn-off semiconductor switches. The connection is designed such that a current can flow via each of the diodes 15, 16 from the first connection 11 and/or the second connection 12 to the series connection 5 comprising the varistor 3 and the capacitor 4, even if the turn-off semiconductor switches are open, i.e. off. The second end 52 of the series connection 5 comprising the varistor 3 and the capacitor 4 is connected to the second potential 42 of the DC network 7.

If a current of the first potential 41 now flows from the DC network 7 to the load 8 through the electronic switch 1, the diode 15 is on and the diode 16 is off. The current flows through the switching element of the turn-off semiconductor switch 2, which is arranged in parallel with the diode 16. If the electronic switch 1 now turns off by virtue of the turn-off semiconductor switch being turned off, then the current through the inductance of the element 25 is continued. It flows from the first connection 11 via the diode 15 to the series connection 5 comprising the varistor 3 and the capacitor 4. As soon as a voltage value prescribed by the varistor is exceeded, the varistor 3 turns on and the capacitor 4 absorbs the energy of the element 25 until the current becomes zero. An overvoltage across the turn-off semiconductor switches 2 is reliably prevented as a result. The same also applies to a flow of current from the load 8 to the DC network 7. In that case, the behavior of the two turn-off semiconductor switches 2 is reversed.

Figure 2:
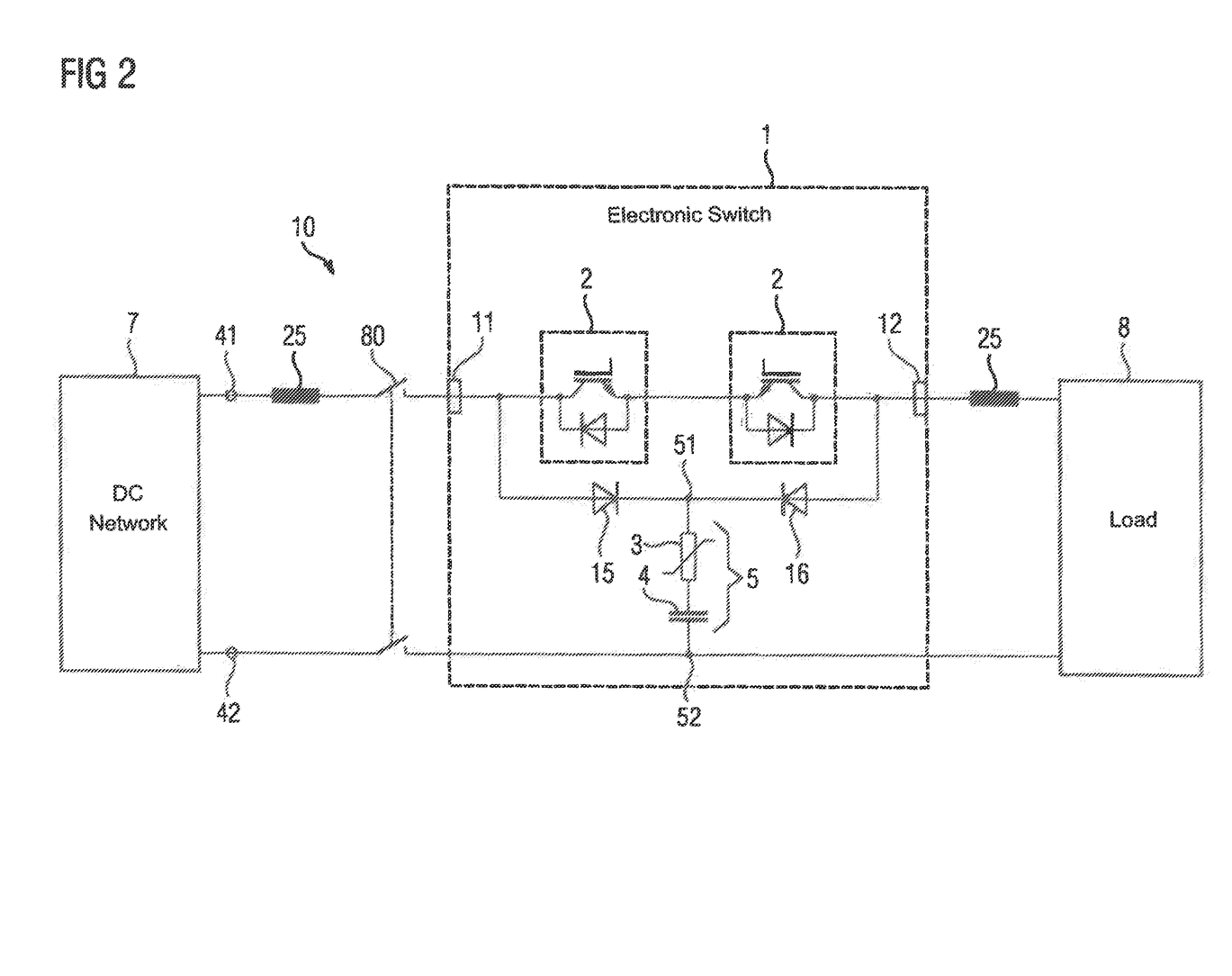

FIG. 2 shows a further exemplary embodiment of an electronic switch 1 having an overvoltage limiter. To avoid repetition, reference is made to the description pertaining to FIG. 1 and to the reference signs introduced therein. In this exemplary embodiment, diodes 15, 16 are used that are not arranged within the turn-off semiconductor switch. These diodes 15, 16 are used for overvoltage protection. They can therefore be designed for the circumstances, i.e. the admissible current and voltage values to be expected. Furthermore, the turn-off semiconductor switches 2 can be arranged in their series connection arbitrarily. The first end of the series connection 5 comprising the varistor 3 and the capacitor 4 is now connected to the connecting point between the two diodes 15, 16. The series connection 5 comprising the varistor 3 and the capacitor 4 is now isolated from a connecting point between the turn-off semiconductor switches 2. In other words, there is now no longer a connection to the series connection 6 comprising the two turn-off semiconductor switches 2. This exemplary embodiment can also be used to implement reliable protection of the turn-off semiconductor switches 2 from an inadmissibly high voltage.

Figure 3:
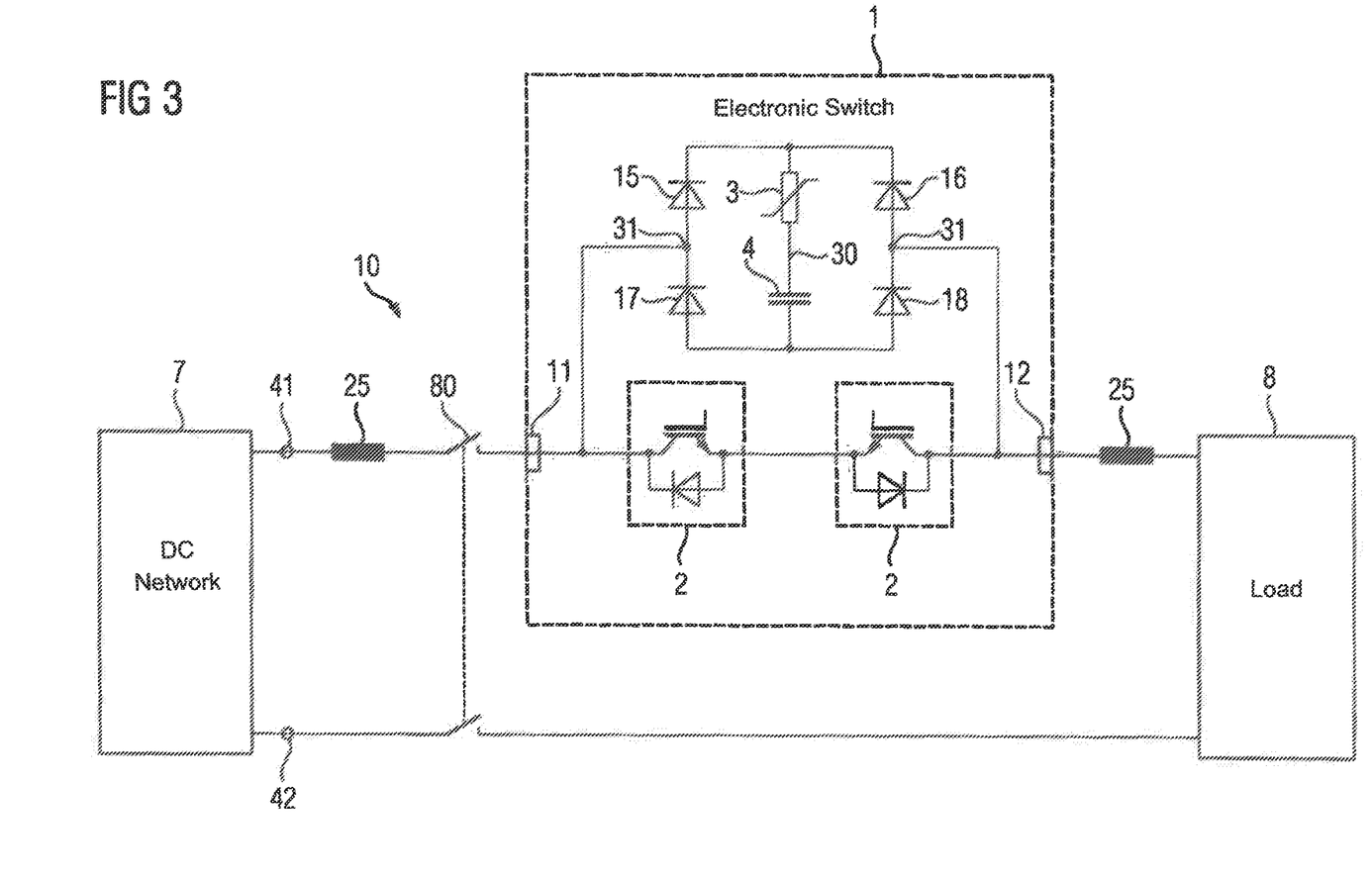

FIG. 3 shows a further exemplary embodiment of an electronic switch 1 having a voltage limiter. To avoid repetition, reference is made to the description pertaining to FIGS. 1 and 2 and to the reference signs introduced therein. The voltage-limiting element comprising the varistor 3 and the capacitor 4, which are arranged in a series connection 5 in this case too, is now independent of the second potential 42 of the DC network 7. The series connection 5 comprising the varistor 3 and the capacitor 4 is connected to the first connection 11 and the second connection 12 of the electronic switch 1 via a bridge rectifier circuit. In this case, the series connection 5 comprising the varistor 3 and the capacitor 4 is in a rectified path 30 of the bridge rectifier circuit. The bridge rectifier circuit has, besides the first diode 15 and the second diode 16, a third diode 17 and a fourth diode 18, which are arranged in a rectifier circuit. The inputs 31 of the bridge rectifier circuit are each connected to the first connection 11 and to the second connection 12 of the electronic switch 1. The bridge rectifier circuit allows voltage limiting to be performed regardless of the direction of current flow through the switch even when a unipolar capacitor is used, for example an electrolytic capacitor. The advantage of this circuit is that it can easily be integrated into an electronic switch 1, and the latter has only one first connection 11 and one second connection 12. A connection for a second potential 42 of the DC network 7 can be dispensed with. This makes the switch particularly appealing, in particular for upgrades to existing installations, since this solution is easily and inexpensively integrable into existing systems.

Figure 4:
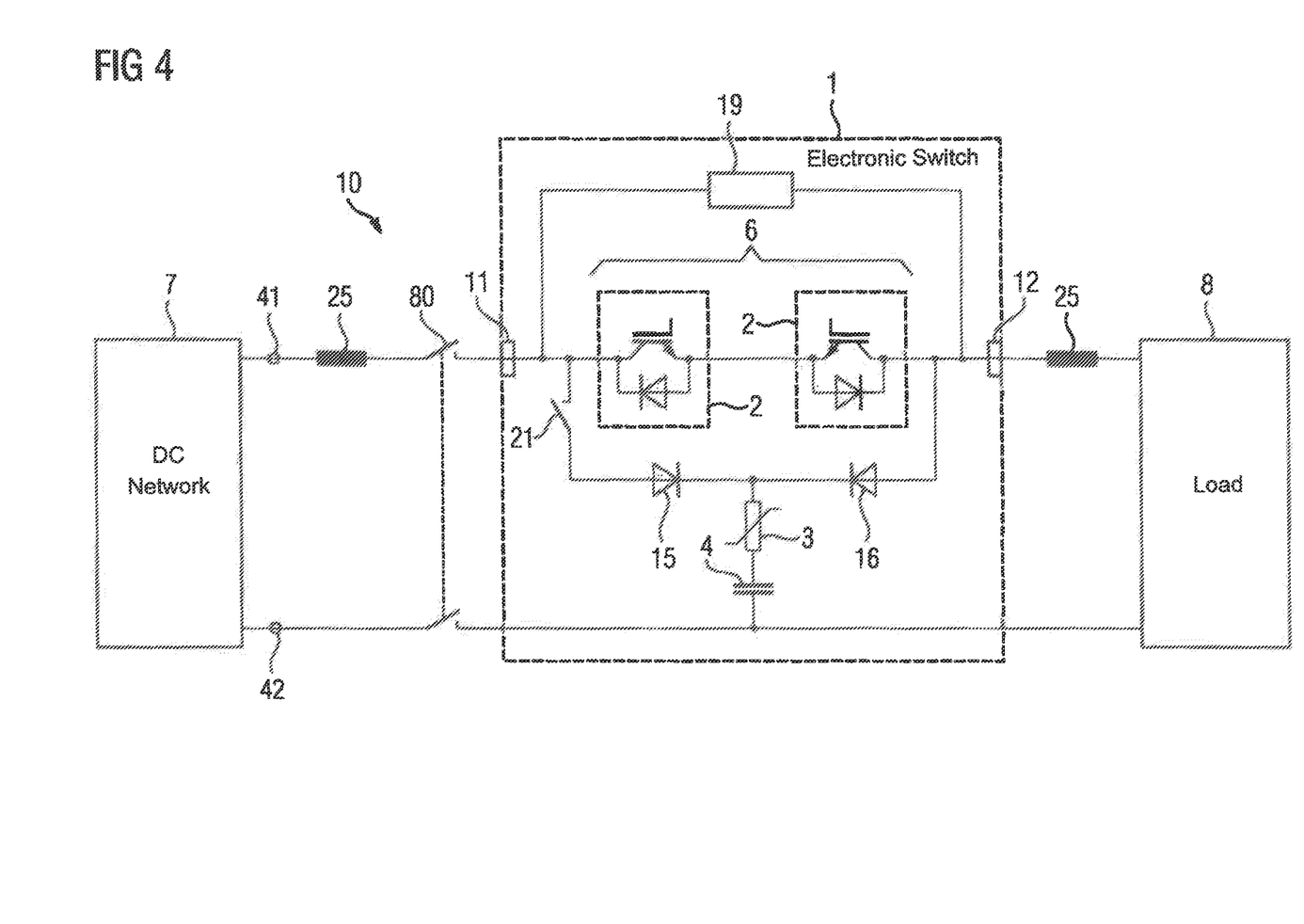

FIG. 4 shows a further exemplary embodiment of an electronic switch 1. In this embodiment, in a similar manner to in FIGS. 1 and 2, the series connection 5 comprising the varistor 3 and the capacitor 4 is arranged between the first potential 41 and the second potential 42 of the DC network 7. Depending on the design of the varistor 3, it can lead to a precharge for the capacitor 4 taking place when the electronic switch 1 is turned on. To keep the loading by excessively high currents in the DC network 7 as low as possible during the precharging of the capacitor 4, a resistor 19 can be used as a series resistor. To ensure that the current for charging the capacitor 4 flows via the resistor 19, a first switch 21 is inserted in series with the first diode 15. This switch 21 remains open for the duration of the precharge, so that a current at the first potential 41 flows from the DC network to the capacitor 4 via the resistor 19 of the diode 16. To avoid repetition, reference is made to the description pertaining to FIGS. 1 to 3 and to the reference signs introduced therein.

Figure 5:
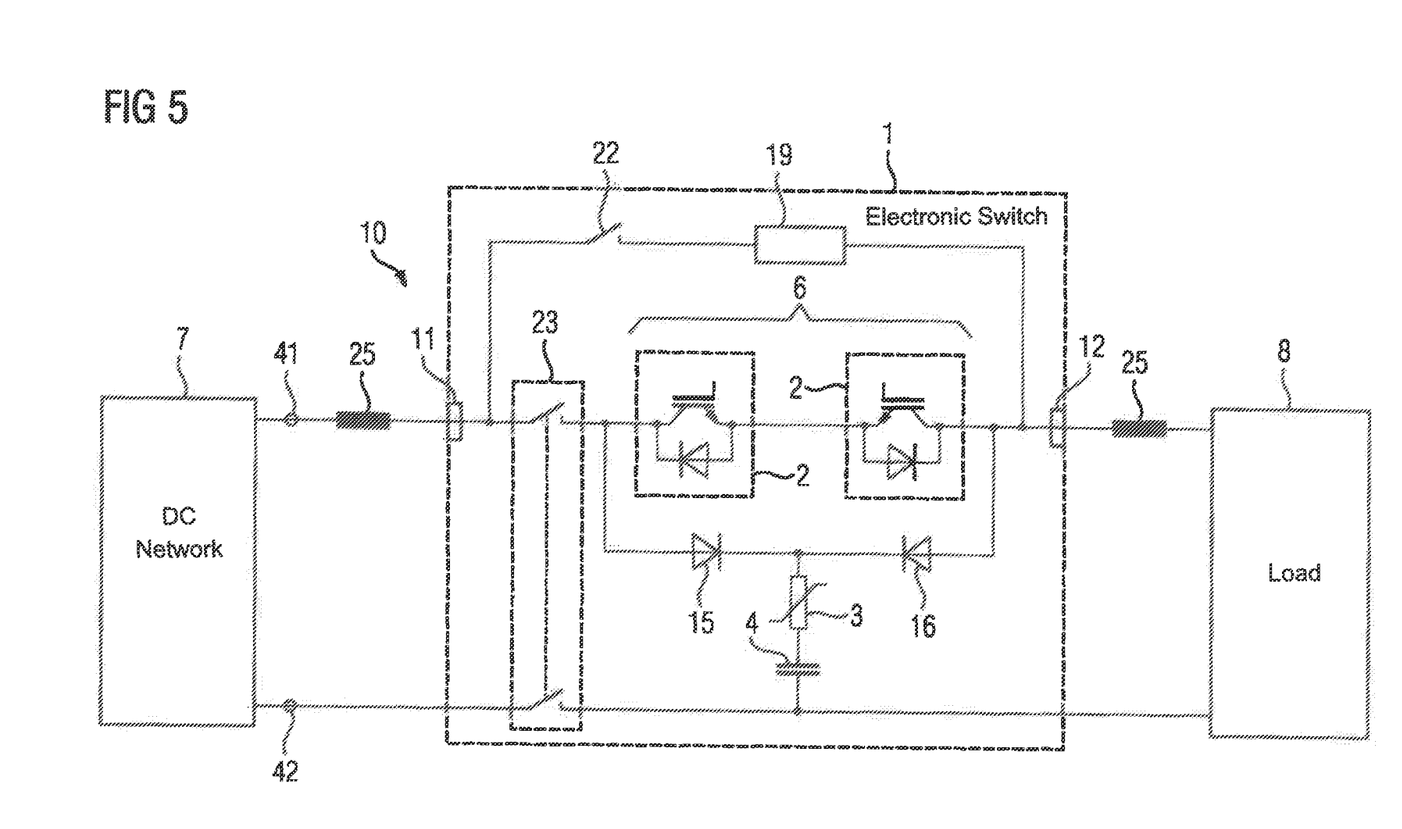

FIG. 5 shows a further exemplary embodiment of an electronic switch 1 having an overvoltage limiter that likewise allows precharging of the capacitor 4 via the resistor 19. To avoid repetition, reference is made to the description pertaining to FIGS. 1 to 4 and to the reference signs introduced therein. In contrast to the exemplary embodiment of FIG. 4, a first switch is no longer present in series with the first diode 15. Instead, a second switch 22 is arranged in series with the resistor 19. This switch 22 connects the first connection 11 of the electronic switch 1 to the resistor 19. A third switch 23, preferably designed as a two-pole switch, is used for galvanically isolating the load 8 from the DC network 7. Said switch is arranged in the electronic switch 1 in this exemplary embodiment. By closing the second switch 22 while the third switch 23 is simultaneously open, it is possible to achieve the effect that the capacitor 4 is precharged via the resistor 19 and the diode 16. Since the flow of current takes place via the resistor 19, this precharging is particularly network-friendly, since the current is limited by the resistor 19 and does not represent inadmissibly high loading. As soon as the capacitor 4 is sufficiently charged, the third switch 23 can be closed. The voltage across the varistor 3 corresponds to the difference between the DC voltage and the voltage across the capacitor 4. If the capacitor 4 is sufficiently charged, the voltage across the varistor 3 is also low enough for the latter no longer to be conductive. In that case, no current flows via the first diode 15 to the capacitor 4 even when the third switch 23 is closed. The precharge is complete in this case and the second switch 22 can also be opened.

In summary, the invention relates to an electronic switch having at least one turn-off semiconductor switch, a varistor and a capacitor, wherein the electronic switch has a first connection and a second connection, between which an electrically conductive connection is makeable or breakable by means of the at least one turn-off semiconductor switch depending on the switching state of the turn-off semiconductor switch. To improve the electronic switch in terms of protection against overvoltages, it is proposed that a series connection comprising the varistor and the capacitor has a first diode connected to the first connection and has a second diode connected to the second connection in each case. The invention further relates to a DC voltage system having an electronic switch of this kind. The invention further relates to a method for limiting overvoltages in an electronic switch of this kind or in a DC voltage system of this kind, wherein inductive energy of an element connected to the electronic switch is transferred to the capacitor during a turn-off process after a limit stipulated by the varistor is exceeded.

The invention claimed is:

1. An electronic switch, comprising:
   at least two turn-off semiconductor switches connected at a connection point in antiseries between a first connection of the electronic switch and a second connection of the electronic switch, said at least two turn-off semiconductor switches configured to make or break an electrical connection between the first connection of the electronic switch and the second connection of the electronic switch,
   a varistor,
   a capacitor connected in series with the varistor to form a series connection, and
   at least two diodes,
   wherein one end of the series connection is connected via a first diode of the at least two diodes to the first connection and via the second diode of the at least two diodes to the second connection, and wherein the first diode and the second diode are connected in antiseries.

2. The electronic switch of claim 1, further comprising a resistor arranged in parallel with the series-connected first and second diodes.

3. The electronic switch of claim 2, further comprising a first switch arranged between the first connection of the electronic switch and the first diode.

4. The electronic switch of claim 2, further comprising a second switch arranged in series with the resistor.

5. The electronic switch of claim 3, further comprising a third switch arranged between the first connection of the electronic switch and one of the at least two turn-off semiconductor switches.

6. The electronic switch of claim 5, wherein the third switch is a multipole switch.

7. The electronic switch of claim 1, wherein the electronic switch comprises at least four diodes forming a bridge rectifier circuit having first and second inputs which are connected to respective first and second connections of the electronic switch.

8. The electronic switch of claim 1, wherein the one end of the series connection of the varistor and the capacitor is connected to the connection point of the electronic switch.

9. The electronic switch of claim 1, wherein the first diode and the second diode are connected in antiseries such that a cathode of the first diode and a cathode of the second diode are connected with each other.

10. A DC voltage system, comprising:
    an electronic switch with
      at least two turn-off semiconductor switches connected at a connection point in antiseries between a first connection of the electronic switch and a second connection of the electronic switch,
      a varistor,
      a capacitor connected in series with the varistor to form a series connection, and at least two diodes,
wherein one end of the series connection is connected via a first diode of the at least two diodes to the first connection and via the second diode of the at least two diodes to the second connection, with the first diode and the second diode being connected in antiseries, and
wherein the electronic switch is configured to break an electrical connection of the DC voltage system between the first connection and the second connection of the electronic switch.

11. The DC voltage system of claim 10, wherein the DC voltage system has a first and a second electrical potential, wherein the first connection of the electronic switch is connected to the first potential and the connection point is connected via the series connection of the capacitor and the varistor to the second electrical potential.

12. A method for limiting overvoltages in the electronic switch of the DC voltage system of claim 10, comprising:
when a limit stipulated by the varistor is exceeded, transferring inductive energy of an element connected to the electronic switch to the capacitor during a turn-off process of at least one turn-off semiconductor switch.

13. The method of claim 12, further comprising, before the electronic switch is turned on, precharging the capacitor with an electric current flowing through a resistor arranged in parallel with the series-connected first and second diodes.

14. The DC voltage system of claim 10, wherein the first diode and the second diode are connected in antiseries such that a cathode of the first diode and a cathode of the second diode are connected with each other.

* * * * *

UNITED STATES PATENT AND TRADEMARK OFFICE
CERTIFICATE OF CORRECTION

PATENT NO. : 11,362,512 B2
APPLICATION NO. : 16/630710
DATED : June 14, 2022
INVENTOR(S) : Schierling et al.

Page 1 of 1

It is certified that error appears in the above-identified patent and that said Letters Patent is hereby corrected as shown below:

On the Title Page

On page 2 Column 2, Line 2, under item [56] FOREIGN PATENT DOCUMENTS:
Replace "CN 106099678 A" with -- CN 106099878 A --.

Signed and Sealed this
Second Day of August, 2022

Katherine Kelly Vidal
*Director of the United States Patent and Trademark Office*